United States Patent
Ibarra et al.

(10) Patent No.: US 10,547,306 B1
(45) Date of Patent: Jan. 28, 2020

(54) CIRCUIT TO REDUCE POWER CONSUMPTION

(71) Applicant: Synapse Wireless, Inc., Huntsville, AL (US)

(72) Inventors: Eric Joseph Ibarra, Madison, AL (US); Jeremy Jacob Zoller, New Market, AL (US)

(73) Assignee: SYNAPSE WIRELESS, INC., Huntsville, AL (US)

( * ) Notice: Subject to any disclaimer, the term of this patent is extended or adjusted under 35 U.S.C. 154(b) by 68 days.

(21) Appl. No.: 15/296,846

(22) Filed: Oct. 18, 2016

(51) Int. Cl.
  *H03K 17/30* (2006.01)
  *H03K 3/012* (2006.01)
  *H03K 17/687* (2006.01)
  *H03K 17/74* (2006.01)
  *G05F 3/18* (2006.01)
  *H02M 3/156* (2006.01)
  *G05F 1/575* (2006.01)
  *G05F 1/613* (2006.01)

(52) U.S. Cl.
  CPC .......... *H03K 17/302* (2013.01); *G05F 1/575* (2013.01); *G05F 1/613* (2013.01); *G05F 3/185* (2013.01); *H02M 3/156* (2013.01); *H03K 3/012* (2013.01); *H03K 17/687* (2013.01); *H03K 17/74* (2013.01); *H03K 2017/307* (2013.01)

(58) Field of Classification Search
  CPC .... H03K 17/74; H03K 17/687; H03K 17/302; H03K 2017/307; H02M 3/07; H02M 3/156; G05F 1/575; G05F 1/613; G05F 3/185
  See application file for complete search history.

(56) References Cited

U.S. PATENT DOCUMENTS

| | | | | |
|---|---|---|---|---|
| 7,733,034 B2 * | 6/2010 | Kotikalapoodi | ... | H05B 33/0815 315/294 |
| 2013/0015833 A1 * | 1/2013 | George | ... | H02M 1/32 323/311 |
| 2014/0145643 A1 * | 5/2014 | Bannister | ... | H05B 33/0812 315/294 |
| 2016/0268902 A1 * | 9/2016 | Yamaguchi | ... | H02M 1/32 |
| 2016/0380541 A1 * | 12/2016 | Moon | ... | G01R 19/04 323/271 |
| 2018/0048227 A1 * | 2/2018 | Kim | ... | H02M 3/073 |

FOREIGN PATENT DOCUMENTS

EP   2284638 A2 *  2/2011  .......... G05F 1/613

OTHER PUBLICATIONS

ON Semiconductor, "MMBZ5221ELT1 Series: Zener Votlage Regulators", retrieved from www.alldatasheet.com/datasheet-pdf/pdf/112596/ONSEMI/MMBZ5240ELT1.html, published Aug. 29, 2014.*

* cited by examiner

*Primary Examiner* — Ryan Johnson
(74) *Attorney, Agent, or Firm* — Angela Holt; Bradley Arant Boult Cummings LLP

(57) ABSTRACT

A switching circuit with switches between a charging path and a low-impedance active path. The charging path comprises a zener diode substantially in parallel with a charging capacitor. Current flows through the charging path when the circuit is powered on and a power supply charges the charging capacitor while current flows through the charging path. The low-impedance bypass path comprises a switch that remains closed until a voltage across the charging capacitor exceeds a threshold voltage. The switch opens when the charging capacitor exceeds the threshold voltage.

3 Claims, 3 Drawing Sheets

US 10,547,306 B1

CIRCUIT TO REDUCE POWER CONSUMPTION

BACKGROUND AND SUMMARY

In a device where power dissipation must be minimized in a diode, a circuit can be constructed such that the average power dissipation in the circuit is significantly reduced when compared to a traditional PN junction diode. This is especially valuable in a sealed enclosure or small space where high power dissipation can cause significant temperature rise and limitation of the maximum current through the device. A common example of this is in the PV junction box where diodes are used extensively to bypass low performing sections of solar cells, allowing the other cells to maximize their power output. Because of the excessive power dissipation in some traditional PN junction diodes, the box can get so hot that the devices inside fail or have a reduced operating life expectancy.

Some methods already exist that utilize a boost driven from the voltage drop across the body diode of a FET. These parts are complicated, expensive and require ultra-low input voltage boost circuits to operate. Additionally, they are limited to the choice of MOSFET picked and integrated into the component by the manufacturer. Building a circuit with discrete component allows the designer to choose a MOSFET that is optimal for the application.

The solution according to the present disclosure is implemented with a switching circuit that switches between a low-impedance "forward conducting bypass" state and a charging state. Ideally the duty cycle is as high as possible, but is practically limited by the quiescent current of the circuit and switching speed. During the charging state, the low-impedance bypass path is shut-off and there is a higher voltage drop across a zener diode that charges the circuit. Once the circuit is fully charged, it switches back into the low impedance "forward conducting" state. The circuit will remain in this "forward conduction" state until the charge has depleted to a level low-enough that the MOSFETs are no longer efficient in providing a low-impedance path. The cycle repeats by cycling between these two states. During the charging state, there will be high power dissipation so it must be kept to a minimum amount of time.

DETAILED DESCRIPTION

Figure 1:
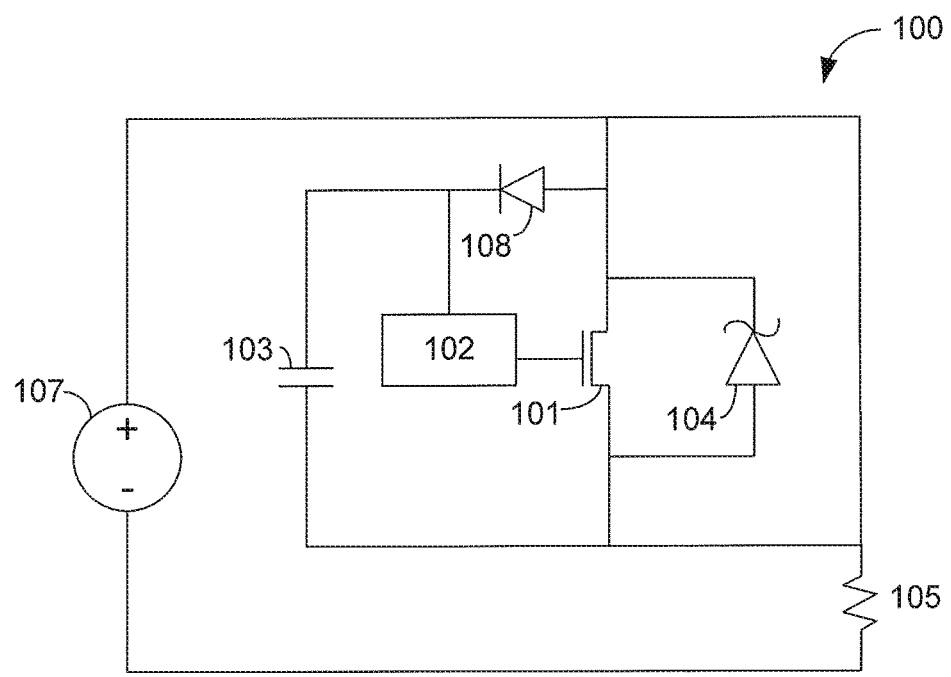
FIG. 1 is a circuit diagram of an exemplary circuit according to an embodiment of the present disclosure.

FIG. 1 depicts a circuit diagram of a simplified circuit 100 according to an exemplary embodiment of the present disclosure. The circuit comprises a power source 107, a load 105, and a field effect transistor (FET) 101. The FET 101 is an enhancement mode metal-oxide semiconductor field effect transistor (MOSFET) in the illustrated embodiment.

The FET 101 is a switch that switches the circuit 100 between a low-impedance "active" state and a "charging" state, as further discussed herein. When the circuit 100 is in the active state, the FET 101 is "closed," and current flows from the power source 107, through the FET 101, and through the load 105. When the circuit 100 is in the charging state, the FET 101 is "open" and no current passes through the FET 101.

The circuit 100 further comprises a capacitor 103 in series with a diode 108, the capacitor 103 and diode 108 together arranged in parallel with the FET 101. A zener diode 104 is also arranged in parallel with the FET 101. When the circuit 100 is in the "charging" state, current flows from the power source 107, through the zener diode 104, and through the load 105, thus bypassing the FET 101 and charging the capacitor 103 to the voltage of the zener diode 104.

A control circuit 102 monitors the voltage of the capacitor 103 and if the capacitor voltage gets too low, the control circuit 102 shuts off the FET 101 to put the circuit back into charging mode to recharge the capacitor 103. The capacitor 103 can be used to power devices (not shown) in need of power.

The state of the FET 101 determines whether the circuit 100 is in the active state or the charging state. When the circuit 100 is initially powered on, the FET 101 will be off, so no current passes through the FET and the circuit is in charging mode.

Figure 2:
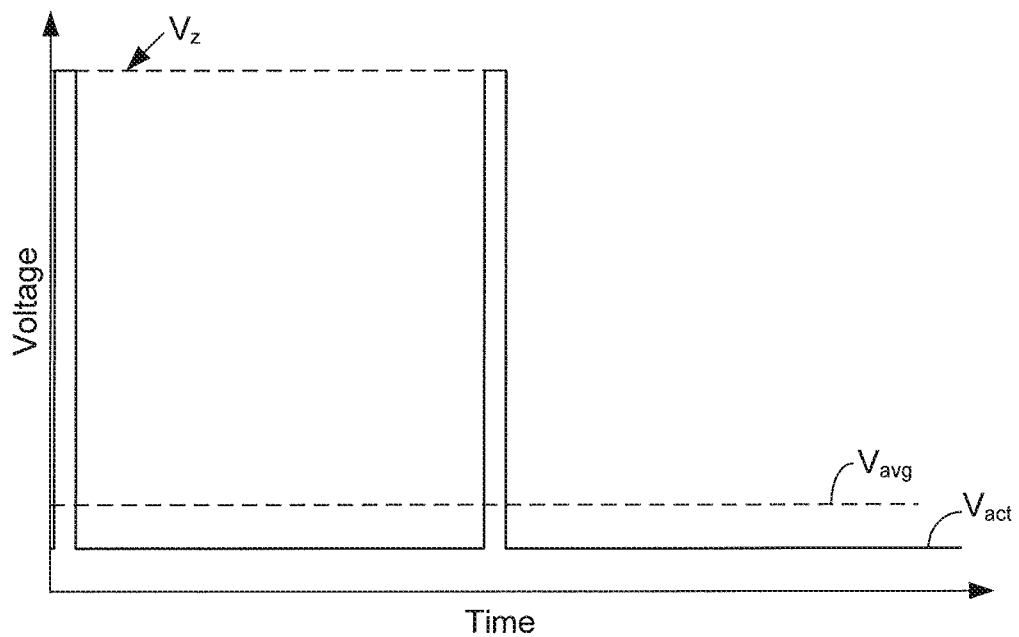
FIG. 2 illustrates the voltage in the circuit of FIG. 1 in an active and charging state.

FIG. 2 illustrates the voltage of the circuit 100 over time. When the circuit 100 first turns on, for a very brief period of time, the current flowing through the circuit charges the capacitor 103 to the voltage "$V_z$" of the zener diode 104. Then the FET 101 turns on, and current flows through the FET, bypassing the zener diode 104. The voltage "$V_{act}$" across the FET 101 drops very low in this active state, such that an average voltage "$V_{avg}$" also stays low.

Figure 3:
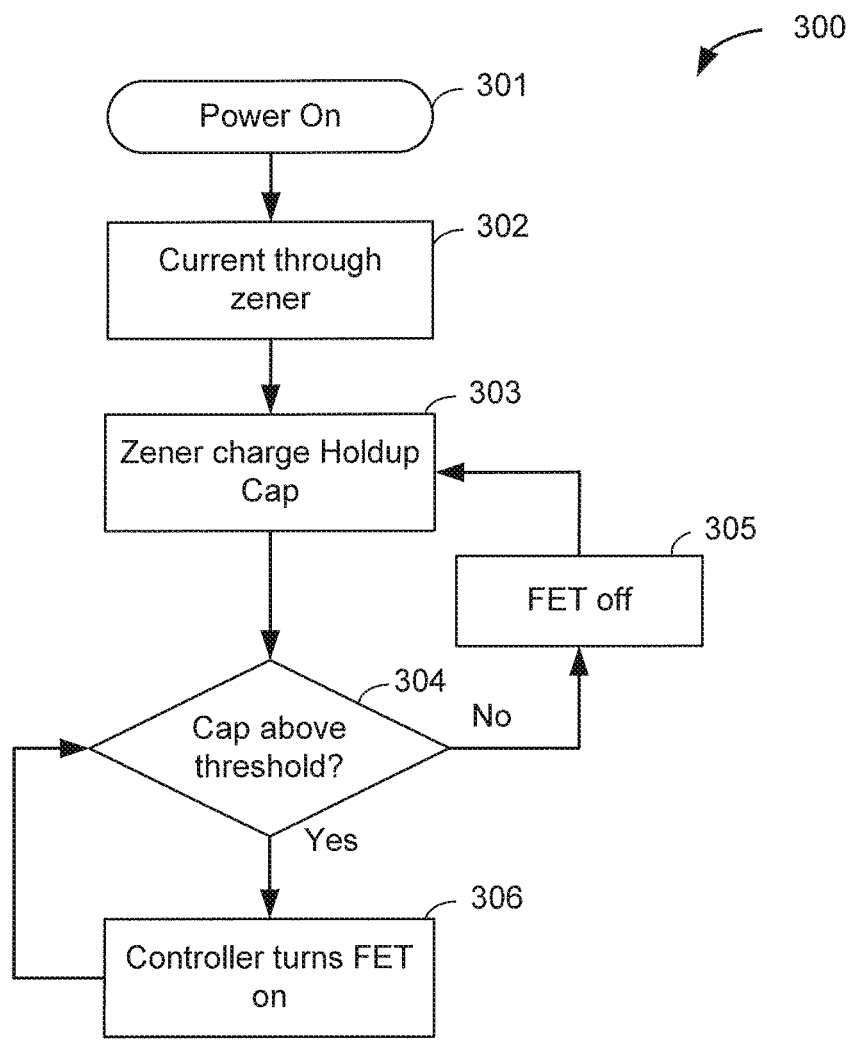
FIG. 3 is a flowchart depicting an exemplary method of operation of a circuit according to an embodiment of the present disclosure.

FIG. 3 is a flowchart depicting an exemplary method 300 of operation of a circuit according to an embodiment of the present disclosure. In step 301 of the method 300, the circuit 100 (FIG. 1) is powered on.

In step 302, current flows through the zener diode 104 (FIG. 1). In step 303, the voltage across the zener diode 104 charges the capacitor 103 (FIG. 1) and the circuit is in the charging state. In step 304, the control circuit 102 monitors the voltage of the capacitor 103 to determine whether it exceeds a predetermined threshold voltage. In step 305, if the voltage of the capacitor 103 is not above the threshold voltage, the FET 101 remains off, and the zener diode 104 continues to charge the capacitor 103.

If, however, the voltage of the capacitor 103 is above the threshold voltage, in step 306 the control circuit 102 turns the FET on to put the circuit in the active state.

The threshold voltage is generally equal to the voltage across the zener diode 104 when the circuit is powered on but the FET 101 is switched off. However, because zener diode voltages can vary due to temperature and the like, the threshold voltage may be slightly lower than the zener voltage, i.e., less than the voltage drop across the zener diode 104.

Figure 4:
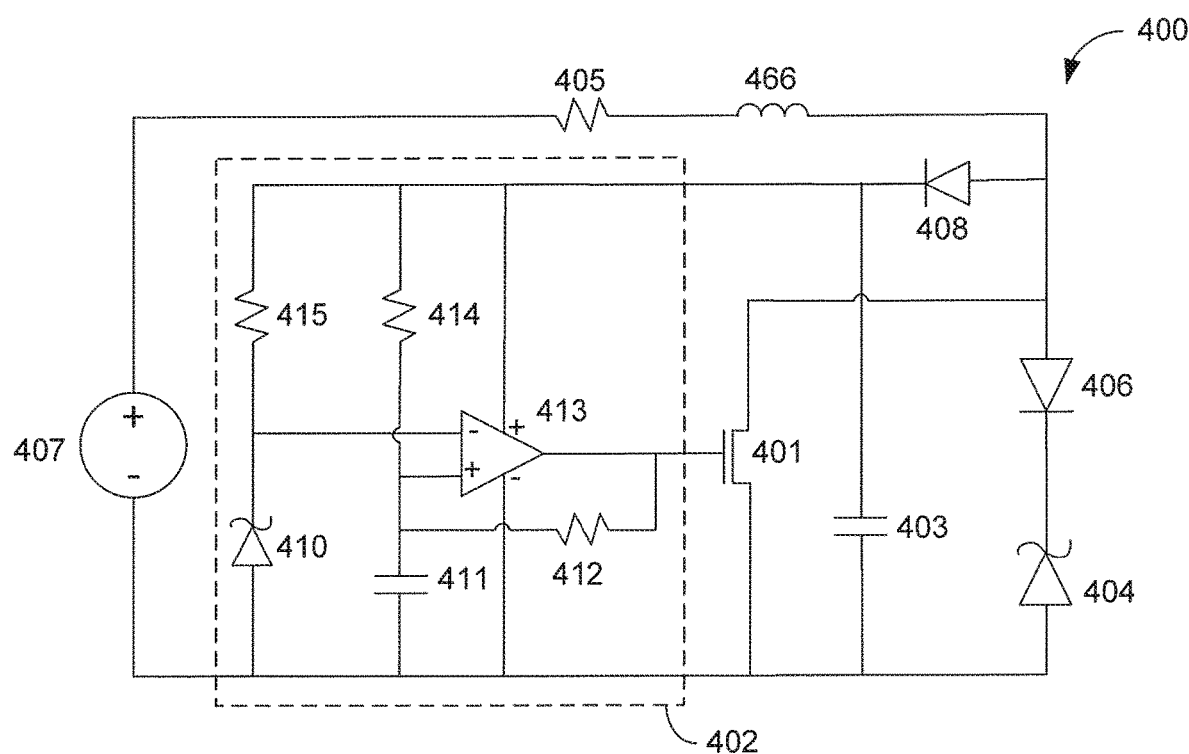
FIG. 4 is a circuit diagram of an exemplary circuit according to an alternative embodiment of the present disclosure.

FIG. 4 is a circuit diagram of an alternative embodiment of a circuit 400 according to the present disclosure. The power source 407 provides power to a load 405. When the circuit 400 is in active mode, a FET 401 is on such that current flows through the FET 401, and bypasses a zener diode 404. When the circuit 400 is in the charging state, the FET 401 is "open" and no current passes through the FET 401. Rather, current passes through the zener diode 404. The voltage across the zener diode 404 charges a capacitor 403.

In one embodiment, the zener diode 404 comprises two 225 mW 10 V±5% zener diodes in parallel and the capacitor is a 10 microfarad capacitor.

Inductor 466 provides a voltage boost that allows the circuit 400 to operate in conditions where the power source is less than the threshold voltage.

Diode 408 is a blocking diode that prevents the capacitor 403 from discharging its stored voltage. In one embodiment, diode 408 is a small signal diode for up to 200 milliamps of current. Diode 406 a reverse current blocking diode that prevents current from flowing in the reverse direction.

A control circuit 402 monitors the voltage of the capacitor 403 and if the capacitor voltage gets too low, the control circuit 402 shuts off the FET 401 to put the circuit back into charging mode to recharge the capacitor 403.

In the illustrated embodiment, the control circuit comprises a voltage comparator 413 which continually compares the voltage across the voltage comparator 413 with a threshold voltage to see if the voltage exceeds the threshold voltage. Resistor 415 is in series with zener diode 410, which provides a reference voltage to the comparator 413. In one embodiment, the zener diode 410 is rated at 225 mW and 8.2 V±5% and resistor 415 is 500K.

Resistor 414 is in series with capacitor 411, which provides the input voltage measurement to the comparator 413. In one embodiment, the capacitor is a 100 pF capacitor and the resistor 414 is 300K. A resistor 412 provides the comparator 413 with hysteresis control during the enable/disable transition. In one embodiment, the resistor 412 is rated at 1 meg.

Figure 5:
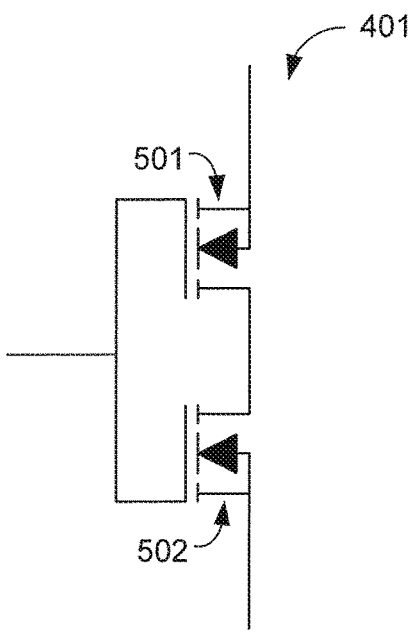
FIG. 5 is an exemplary FET in a circuit according to an exemplary embodiment of the present disclosure.

FET 401 is shown in the circuit diagram of FIG. 4 in a simplified form. FIG. 5 is an exemplary FET 401, in which a first FET 501 is in a back-to-back configuration with a second FET 502. This configuration ensures that current cannot flow backwards through the circuit 400 when the circuit is off (i.e., in a charging state).

This disclosure may be provided in other specific forms and embodiments without departing from the essential characteristics as described herein. The embodiments described are to be considered in all aspects as illustrative only and not restrictive in any manner.

What is claimed is:

1. A circuit comprising:
   a power source for providing power to a load;
   a field effect transistor switch in parallel with a zener diode;
   a storage capacitor arranged in the circuit such that when the field effect transistor switch is off, the power source begins charging the storage capacitor;
   a control circuit configured to cause the field effect transistor switch to switch on when the storage capacitor reaches a threshold voltage, where the switching on of the field effect transistor switch causes the current to bypass the zener diode such that the storage capacitor stops charging, the control circuit comprising a voltage comparator which continually compares the voltage across the voltage comparator with a threshold voltage and turns the switch on when the voltage across the storage capacitor exceeds the threshold voltage;
   a resistor in series with a reference zener diode, the reference zener diode providing a reference voltage to the voltage comparator.

2. The circuit of claim 1 the control circuit further comprising a resistor in series with a capacitor, the capacitor providing an input voltage measurement to the voltage comparator.

3. The circuit of claim 2, wherein the capacitor is a 100 pF capacitor and the resistor is 300K Ohms.

* * * * *